(12) United States Patent
Matsumura et al.

(10) Patent No.: US 7,345,352 B2
(45) Date of Patent: Mar. 18, 2008

(54) INSULATING TUBE, SEMICONDUCTOR DEVICE EMPLOYING THE TUBE, AND METHOD OF MANUFACTURING THE SAME

(75) Inventors: Tsuyoshi Matsumura, Yokohama (JP); Takahito Nakajima, Yokohama (JP); Hiroshi Kawamoto, Kamakura (JP); Mikie Miyasato, Yokohama (JP); Yoshihiro Uozumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/715,844

(22) Filed: Mar. 9, 2007

(65) Prior Publication Data

US 2007/0170594 A1 Jul. 26, 2007

Related U.S. Application Data

(62) Division of application No. 11/244,293, filed on Oct. 6, 2005, now Pat. No. 7,282,437, which is a division of application No. 10/693,504, filed on Oct. 27, 2003, now Pat. No. 6,995,472.

(30) Foreign Application Priority Data

Jul. 28, 2003 (JP) ............................ P2003-202486

(51) Int. Cl.
*H01L 29/00* (2006.01)
(52) U.S. Cl. .................. 257/513; 257/210; 257/211; 257/774; 257/758
(58) Field of Classification Search ................ 257/210, 257/211, 513, 774, 758
See application file for complete search history.

(56) References Cited

U.S. PATENT DOCUMENTS 6,159,842 A 12/2000 Chang et al.
6,177,329 B1 1/2001 Pang
6,534,870 B1 3/2003 Shimooka et al.
6,784,109 B2 8/2004 Kofuji et al.
7,015,150 B2 3/2006 Cooney et al.
2003/0067077 A1* 4/2003 Lee ........................... 257/758
2003/0183940 A1* 10/2003 Noguchi et al. ............ 257/767

(Continued)

FOREIGN PATENT DOCUMENTS

JP 3-156929 7/1991

(Continued)

OTHER PUBLICATIONS

Notification of Reasons for Refusal issued by the Japanese Patent Office on Feb. 20, 2007, for Japanese Patent Application No. 2003-202486, and English-language translation thereof.

*Primary Examiner*—Evan Pert
*Assistant Examiner*—Tan Tran
(74) *Attorney, Agent, or Firm*—Finnegan, Henderson, Farabow, Garrett & Dunner, L.L.P.

(57) ABSTRACT

An insulating tube includes a underlying insulating film, a first sidewall insulating film disposed on the underlying insulating film, a second sidewall insulating film disposed on the underlying insulating film, opposite to the first sidewall insulating film so as to provide a cavity between the first and second sidewall insulating films having the same height as the first sidewall insulating film, and an upper insulating film provided over the first and second sidewall insulating films.

4 Claims, 12 Drawing Sheets

U.S. PATENT DOCUMENTS

2003/0189254 A1 * 10/2003 Yew et al. .................. 257/773
2006/0046472 A1    3/2006 Sandhu et al.

FOREIGN PATENT DOCUMENTS

| JP | 4-207055 | 7/1992 |
| JP | 5-21617 | 1/1993 |
| JP | 8-83839 | 3/1996 |
| JP | 10-284592 | 10/1998 |
| JP | 11-243145 | 9/1999 |
| JP | 11-297827 | 10/1999 |

* cited by examiner

INSULATING TUBE, SEMICONDUCTOR DEVICE EMPLOYING THE TUBE, AND METHOD OF MANUFACTURING THE SAME

CROSS REFERENCE TO RELATED APPLICATIONS

This is a divisional application of U.S. patent application Ser. No. 11/244,293, filed Oct. 6, 2005 now U.S. Pat. No. 7,282,437, which is a divisional application of U.S. patent application Ser. No. 10/693,504, filed Oct. 27, 2003, which issued as U.S. Pat. No. 6,995,472, on Feb. 7, 2006, which are incorporated herein by reference.

This application is based upon and claims the benefit of priority from the prior Japanese Patent Applications No. P2003-202486, filed on Jul. 28, 2003; the entire contents of which are incorporated herein by reference.

BACKGROUND OF THE INVENTION

1. Field of the Invention

The present invention relates to semiconductor device technology, more specifically to a structure of insulator film using a porous low dielectric constant film.

2. Description of the Related Art

Along with the miniaturization of semiconductor devices, transmission delays and signal interruption by crosstalk between wirings have become a subject to closer examination. Copper (Cu) having a lower resistivity than aluminum (Al) has been adopted as a metal wiring and a method for suppressing wiring resistance by 30% has been employed. A low-k film having a lower dielectric constant than a silicon oxide film ($SiO_2$) has been adopted as an interlayer insulating film and a method of reducing capacitance between wirings has also been examined.

In order to provide an insulating film having a low dielectric constant, a porous low dielectric film (hereinafter called "porous-low-k film") is achieved by providing microscopic pores in an insulating film and thus decreasing an apparent relative dielectric constant. Particularly, deposition methods, such as method for increasing pore size of the porous-low-k film and method for achieving an even distribution of the pores, has been tried.

However, when the porosity of the porous-low-k film is increased, mechanical strength of the insulating film is weakened. Thus, the insulating film is destroyed by stresses applied thereto in the processes of plasma, ashing, chemical-mechanical polishing (CMP) and the like. When the strength of the insulating film is weakened by the inclusion of many pores in the porous-low-k film, the insulating film may be peeled off from wiring adjacent thereto. Moreover, since the porous-low-k film has high hygroscopicity, the relative dielectric constant may change over time and it is difficult to control wiring capacity.

SUMMARY OF THE INVENTION

An aspect of the present invention inheres in a an insulating tube embracing a underlying insulating film; a first sidewall insulating film disposed on the underlying insulating film; a second sidewall insulating film disposed on the underlying insulating film, opposite to the first sidewall insulating film so as to provide a cavity between the first and second sidewall insulating films having the same height as the first sidewall insulating film; and an upper insulating film provided over the first and second sidewall insulating films.

Another aspect of the present invention inheres in a semiconductor device employing the insulating tube embracing a substrate; a first interlayer insulating film disposed on the substrate; a underlying insulating film disposed on the first interlayer insulating film; a first sidewall insulating film disposed on the underlying insulating film; a second sidewall insulating film disposed on the underlying insulating film, opposite to the first sidewall insulating film so as to provide a cavity between the first and second sidewall insulating films having the same height as the first sidewall insulating film; an upper insulating film provided over the first and second sidewall insulating films; and a wiring disposed around the first and second sidewall insulating films.

Still another aspect of the present invention inheres in a method of manufacturing a semiconductor device employing the insulating film embracing depositing a first interlayer insulating film on a substrate; depositing a underlying insulating film on the interlayer insulating film; depositing a porous-low-k film on the underlying insulating film; depositing a low-k film on the porous-low-k film; etching the porous-low-k film and the low-k film so as to provide a groove and changing chemical compositions of a residual part of the porous-low-k film and a residual part of the low-k film, and forming first and second sidewall insulating films at sidewall portions of the residual porous-low-k film, and forming first and second side-beams at the sidewall portions of the residual low-k film; and removing a central portion of the residual porous-low-k film formed between the first and second sidewall insulating films.

DETAILED DESCRIPTION OF THE INVENTION

Figure 1:
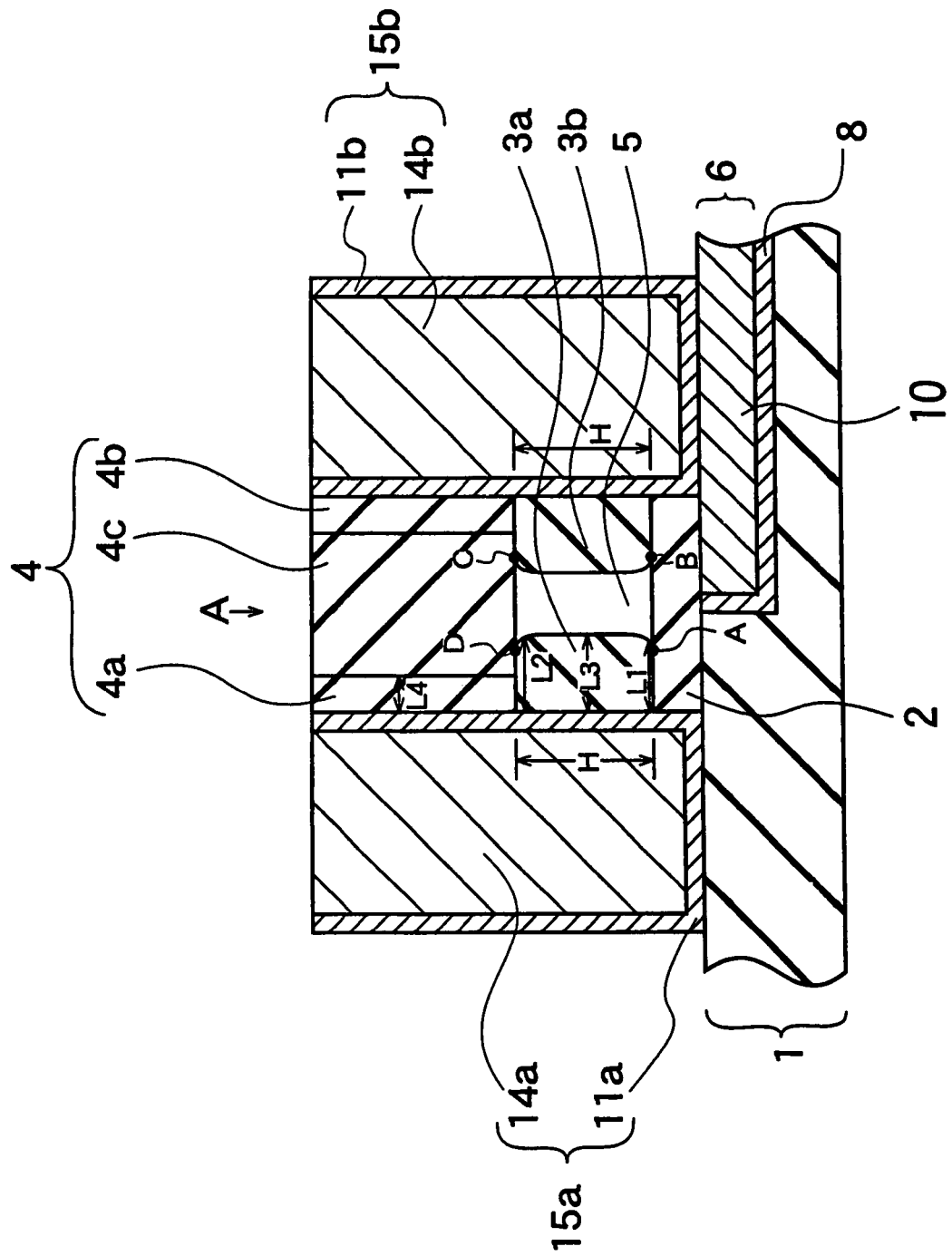
FIG. 1 is a sectional view showing an example of an insulating tube according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of insulating tubes of semiconductor devices, it will be appreciated that the various drawings are not drawn to scale from one figure to another nor inside a given figure, and in particular that the layer thicknesses are arbitrarily drawn for facilitating the reading of the drawings. In the following descriptions, numerous details are set forth such as specific signal values, etc. to provide a thorough understanding of the present invention. However, it will be obvious to those skilled in the art that the present invention may be practiced without such specific details.

First Embodiment

As shown in FIG. 1, an insulating tube according to a first embodiment of the present invention encompasses a underlying insulating film 2, a first sidewall insulating film 3a disposed on the underlying insulating film 2; a second sidewall insulating film 3b disposed on the underlying insulating film, opposite to the first sidewall insulating film so as to provide a cavity 5 between the first and second sidewall insulating films 3a and 3b, and an upper insulating film 4 over the first and second sidewall insulating films 3a and 3b. The upper insulating film 4 embraces a central beam 4c which is laid over the first and second sidewall insulating films 3a and 3b so as to seal an upper portion of the cavity 5, and first and second side-beams 4a and 4b disposed on the first and second sidewall insulating films 3a and 3b, respectively, so as to sandwich the central beam 4c therebetween. Here, the "cavity 5" defines a hollow space with a diameter of 10 nm to 50 nm, which is sufficiently larger than micro pores forming a porous-low-k film, the pore having a diameter of 0.01 nm to 0.1 nm. The underlying insulating film 2 is disposed on an interlayer insulating film 1. On an upper portion of the interlayer insulating film 1 and on sidewall portions of the underlying insulating film 2, the first and second sidewall insulating films 3a and 3b and the first and second side-beams 4a and 4b form a bridge structure over the cavity 5. A pair of first and second wirings 15a and 15b extending in a longitudinal direction perpendicular to the plane of the paper is disposed so as to sandwich the bridge structure. The first wiring 15a encompasses a first barrier metal 11a contacting the upper portion of the interlayer insulating film 1 and the respective sidewall portions of the underlying insulating film 2, the first sidewall insulating film 3a and the first side-beam 4a, and a first wiring core 14a disposed on the first barrier metal 11a. The second wiring 15b encompasses a second barrier metal 11b contacting the respective sidewall portions of the underlying insulating film 2, the second sidewall insulating film 3b and the second side-beam 4b, and a second metal wiring core 14b disposed on the second barrier metal 11b.

As the interlayer insulating film 1, for example, a $SiO_2$-based oxide film or the like can be adopted. The interlayer insulating film 1 has a groove 6 at a side where the interlayer insulating film 1 contacts the underlying insulating film 2 and a wiring core 10 is buried in the groove 6 with a barrier metal 8 between the interlayer insulating film 1 and the groove 6. The wiring core 10 is disposed on the barrier metal 8 with a Cu seed film (not shown) deposited to have a thickness of about 50 to 100 nm therebetween. A film thickness of the barrier metal 8 is about 20 nm to 70 nm and titanium nitride (TiN) tantalum (Ta), tantalum nitride (TaN), tungsten nitride (WN) or the like can be used. Note that the more thinly the barrier metal 8 is deposited, the more the wiring resistance thereof can be reduced. Thus, the film thickness of the barrier metal 8 is suitably 20 nm to 50 nm, more suitably 20 nm to 40 nm.

For the underlying insulating film 2, a silicon nitride film (a $Si_3N_4$ film) with a film thickness of about 10 nm to 200 nm or the like can be adopted. The $Si_3N_4$ film used as the underlying insulating film 2 generally has a relative dielectric constant as high as about 7 and increases a dielectric constant of the entire wiring. Thus, it is suitable that the $Si_3N_4$ film is thinly deposited to have a film thickness of about 10 nm to 100 nm. More suitably, the film thickness of the underlying insulating film 2 is 10 nm to 50 nm.

The first and second sidewall insulating films 3a and 3b are bank shaped vertical stripes facing each other. In each of the first and second sidewall insulating films 3a and 3b, a film thickness L3 in a middle portion thereof extends by about 80 nm to 150 nm in a length direction thereof along a periphery of the underlying insulating film 2. As shown in FIG. 1, in each of the first and second sidewall insulating films 3a and 3b, a height H is greater than the width L3 and an aspect ratio thereof is about 1.2 to 2. Here, the "height H" defines a length measured along a direction of depositing the films. Moreover, the "width L3" defines a length in a direction orthogonal both to the "height H" direction and the longitudinal direction of the stripes, (the stripes run perpendicular to the plane of the paper). That is, the width L3 is measured along the horizontal direction in FIG. 1. Accordingly, a space between the first and second sidewall insulating films 3a and 3b defines the cavity 5 extending in the longitudinal direction perpendicular to the plane of the paper. As shown in FIG. 1, in the cavity 5, a vertical cross-section in the longitudinal direction has an approximately square shape. The "approximately square shape" defines a shape obtained in such a manner that contact portions between the first and second sidewall insulating films 3a and 3b and the underlying insulating film 2 and contact portions between the first and second sidewall insulating films 3a and 3b and the upper insulating film 4 are eroded toward the first and second sidewall insulating films 3a and 3b, leaving gradually narrowing space tails into the contact interfaces, so as to make four angles A to D, shown in FIG. 1, of the cavity 5 acute, respectively. Thus, in each of the first and second sidewall insulating films 3a and 3b, a width L1 of a bottom portion contacting the underlying insulating film 2 (bottom portion width L1) and a width L2 of a top portion contacting the upper insulating film 4 (top portion width L2) are made narrower, respectively, than the width L3 of the middle portion (middle portion width L3) spaced from the contact portions. In the insulating tube shown in FIG. 1, the bottom portion width L1 is about 45 nm, the middle portion width L3 is about 65 nm and the top portion width L2 is about 50 nm. Suitably, the bottom portion width L1 is about 45 to 65 nm, the middle portion width L3 is about 50 to 90 nm and the top portion width L2 is about 45 to 60 nm. Note that the first and second sidewall insulating films 3a and 3b are transmuted layers of the porous-low-k film, in which a chemical composition of each film is changed from that of the porous-low-k film immediately after deposited on the underlying insulating film 2 and is hardened. The first and second sidewall insulating films 3a and 3b have a relative dielectric constant higher than that of the porous-low-k film immediately after deposited on the underlying insulating film 2.

The upper insulating film 4 is a pure and dense insulating film having a higher relative dielectric constant than the first and second sidewall insulating films 3a and 3b. In FIG. 1, as the upper insulating film 4, a SiO-based or organic insulating film having a film thickness of about 100 nm to 250 nm is used. It is suitable that the upper insulating film 4 is thinly deposited to have a film thickness of about 10 to 100 nm or about 10 to 50 nm. The first and second side-beams 4a and 4b forming the upper insulating film 4 are stripes formed on the first and second sidewall insulating films 3a and 3b, respectively. Between the first and second side-beams 4a and 4b, the central beam 4c is disposed extending in the longitudinal direction perpendicular to the plane of the paper. This central beam 4c is disposed over the cavity 5 to seal the upper portion of the cavity 5. Similar to the first and second sidewall insulating films 3a and 3b, heights of the first and second side-beams 4a and 4b and the central beam 4c are greater than widths thereof. For example, an aspect ratio of the width and height of each of the first and second side-beams 4a and 4b is about 4 to 6. Moreover, an aspect ratio of the width and height of the central beam 4c is about 1.2 to 2.5. Note that the first and second side-beams 4a and 4b are transmuted layers in which a chemical composition of the film is changed and hardened. A width L4 of each of the first and second side-beams 4a and 4b is thinner than the widths L1 to L3 of each of the first and second sidewall insulating films 3a and 3b. In FIG. 1, each of the first and second side-beams 4a and 4b is formed to have the width L4 of about 20 nm. The width L4 of each of the first and second side-beams 4a and 4b is suitably formed to be about 20 to 45 nm. The width of the central beam 4c is about 100 nm to 160 nm.

Figure 2:
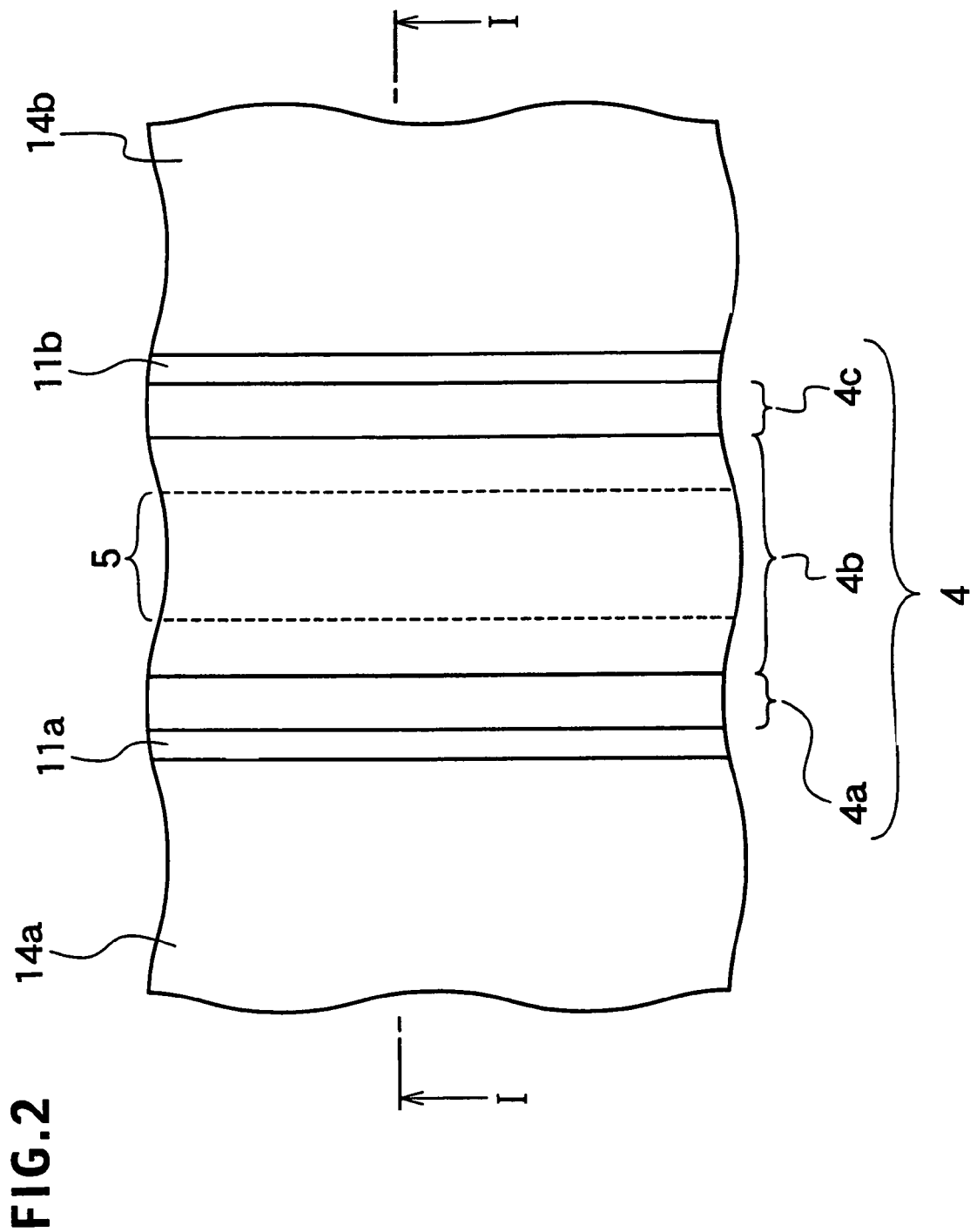
FIG. 2 is a sectional view taken on line I-I in FIG. 1.

As shown in FIG. 2, on both sides of the upper insulating film 4 including the first and second side-beams 4a and 4b and the central beam 4c, the first and second wiring cores 14a and 14b are disposed along a longitudinal direction of the upper insulating film 4 (a perpendicular direction to the plane of the paper) with the first and second barrier metals 11a and 11b interposed therebetween. As indicated by the dotted lines in FIG. 2, the cavity 5 extends below the central beam 4b, which extends in the longitudinal direction perpendicular to the plane to the paper, in parallel therewith.

In the insulating tube shown in FIG. 1, a relative dielectric constant of the cavity 5 formed between the first and second sidewall insulating films 3a and 3b is equal to a relative dielectric constant of air, that is, about 1. Thus, the insulating tube shown in FIG. 1 can decrease an effective dielectric constant compared to the case of using a porous-low-k film with no cavity 5 and can reduce a capacity between the wirings in the entire device. Moreover, the first and second sidewall insulating films 3a and 3b disposed around the cavity 5 are the transmuted layers, in which atomic bonds forming the insulating films is changed and hardened. Thus, the mechanical strength of the film is higher than that of the porous-low-k film immediately after deposited on the underlying insulating film 2. Consequently, the first and second sidewall insulating films 3a and 3b can serve as "sidewalls" for supporting the hollow space between the underlying insulating film 2 and the upper insulating film 4. In addition, the structure makes it unlikely for destruction of the porous-low-k film to occur in a semiconductor device manufacturing process such as CMP.

Next, a method of manufacturing an insulating film and a semiconductor device employing the insulating tube according to the first embodiment of the present invention are described. Note that the method of manufacturing the insulating film and the semiconductor device to be described below is an example. Thus, it is needless to say that the present invention can be achieved by use of various other manufacturing methods including a modified example of the method described below.

Figure 3:
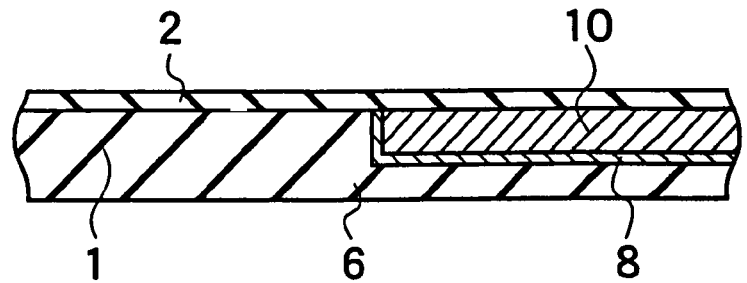
FIGS. 3 to 9 are sectional views showing a method of manufacturing the insulating tube and a semiconductor device using the insulating tube according to the first embodiment of the present invention.

(a) First, as shown in FIG. 3, an interlayer insulating film 1 made of a $SiO_2$ film having a film thickness of 50 nm to 150 nm is formed on a substrate (not shown). As the interlayer insulating film, besides the $SiO_2$ film, a phosphosilicate glass (PSG) film, a boro-phospho-silicate glass (BPSG) film, a $Si_3N_4$ film, a polyimide film or the like may be used. Thereafter, a photoresist film is spin-coated on a surface of the interlayer insulating film 1 and is delineated by use of photolithography technology. Subsequently, a part of the interlayer insulating film 1 is selectively stripped by reactive ion etching (RIE) or the like by use of the delineated photoresist film as an etching mask. Thus, a groove 6 is formed. Next, on a surface of the groove 6, a barrier metal 8 is deposited to have a film thickness of about 30 to 50 nm by use of plasma CVD or the like. The film thickness of the barrier metal 8 is not particularly limited as long as the film thickness thereof is capable of suppressing diffusion of metals of a wiring core 10 to be described later. Note that, in FIG. 3, a material containing Ta or a material containing Ta and nitrogen (N) is used as the barrier metal 8. However, the material of the barrier metal 8 is not particularly limited thereto as long as the material thereof is capable of providing a sufficient barrier property with respect to metals forming wirings, such as Cu. Next, on the barrier metal 8, a Cu seed layer (not shown), for example, is deposited by sputtering. Furthermore, the surfaces of the wiring core 10, the barrier metal 8 and the interlayer insulating film 1 are planarized by use of a CMP method or the like. Thereafter, a underlying insulating film 2 is deposited on the entire surface of the planarized interlayer insulating film 1 by use of CVD or the like.

Figure 4:
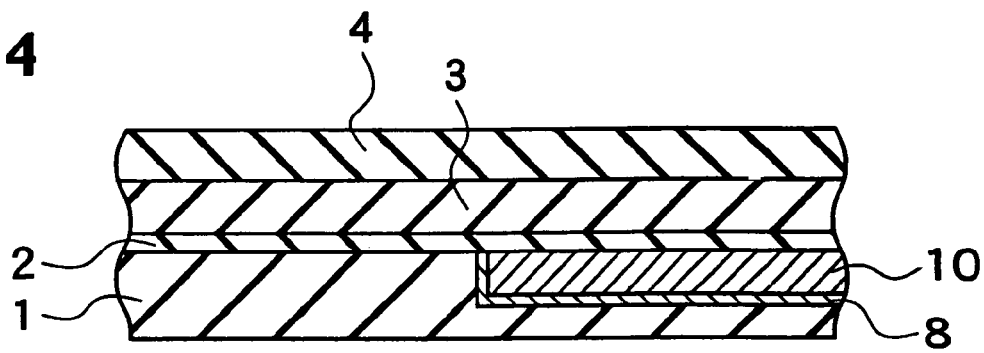
Figure 5:
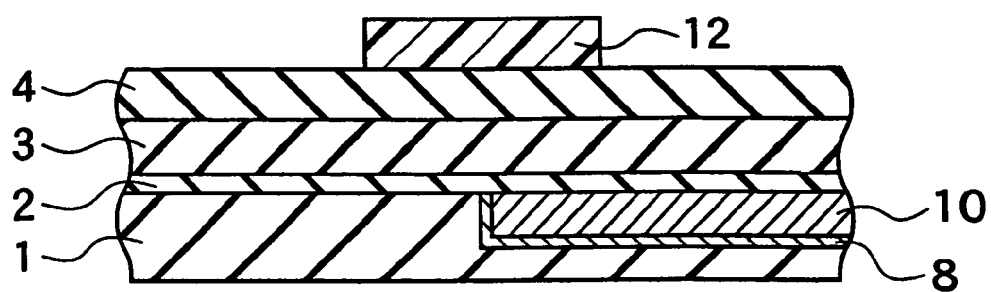
Figure 6:
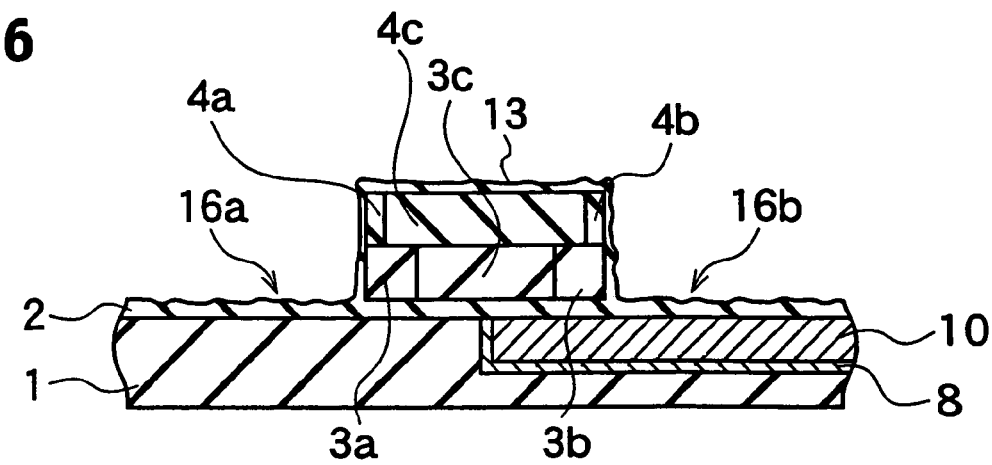
Figure 7:
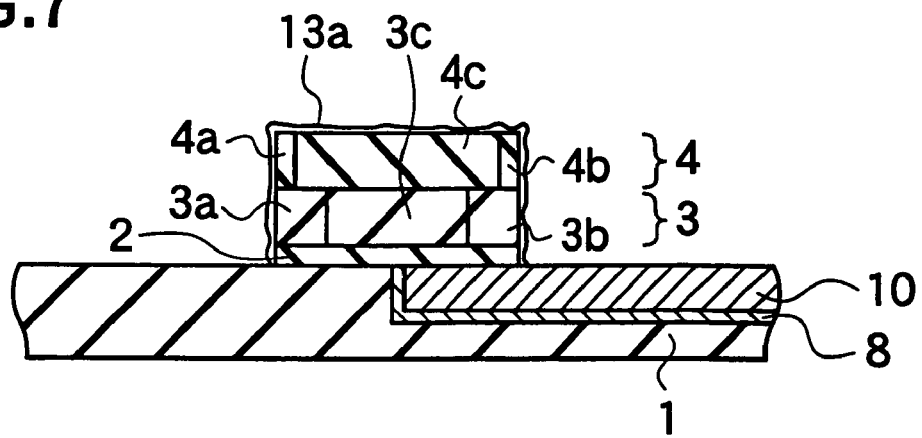

(b) Next, as shown in FIG. 4, on the-underlying insulating film 2, a porous-low-k film 3 is deposited to have a film thickness of about 10 nm to 250 nm by use of CVD or the like. As the porous-low-k film 3, a $SiO_2$-based interlayer film which has a porous structure and has a relative dielectric constant of about 3 can be used. Thereafter, on the porous-low-k film 3, a low-k film 4 having a higher relative dielectric constant than the porous-low-k film 3 is deposited to have a film thickness of 10 nm to 250 nm. As the low-k film 4, a SiO-based or organic highly pure and dense insulating film is used. Subsequently, a photoresist film 12 is applied onto the low-k film 4 and, as shown in FIG. 5, the photoresist film 12 is delineated by use of photolithography technology. The resultant structure is subjected to RIE using fluorine gas and the like by use of the delineated photoresist film 12 as an etching mask. As a result, the porous-low-k film 3 and the low-k film 4 are partially stripped to form grooves 16a and 16b as shown in FIG. 6. On the surfaces of the porous-low-k film 3 and the low-k film 4, which remain above the interlayer insulating film 1, chemical compositions of the films are changed by erosion caused by the fluorine gas used in RIE and are hardened. For example, in the case where a $SiO_2$-based insulating film containing an organic compound (methyl group compound) is used as the porous-low-k film 3 shown in FIG. 4, a $Si—CH_3$ bond of first and second sidewall insulating films 3a and 3b shown in FIG. 6 is replaced with a Si—OH bond or a Si—O bond. As a result, the first and second sidewall insulating films 3a and 3b are formed in sidewall portions of the porous-low-k film 3 and the porous-low-k film 3 remains in a central portion as an absorption layer 3c of low-pressure gas. Furthermore, in sidewall portions of the low-k film 4, first and second side-beams 4a and 4b are formed, respectively. Moreover, as shown in FIG. 6, on the interlayer insulating film 1, the underlying insulating film 2, the porous-low-k film 3 and the low-k film 4, a residue (a by-product of reaction) 13 of the etching remains. Thereafter, a large part of the residue 13 is removed by ashing as shown in FIG. 7. Note that, in this ashing process, the fluorine gas used in RIE further permeates into microscopic pores having a size of 0.01 nm to 0.1 nm in the low-pressure gas absorption layer 3c formed between the first and second sidewall insulating films 3a and 3b from the surfaces of the first and second sidewall insulating films 3a and 3b. The penetration speed of the low-pressure gas into the low-k film 4 is slower than that of the porous-low-k film 3. Consequently, the widths of the first and second side-beams 4a and 4b are thinner than the first and second sidewall insulating films 3a and 3b.

(c) Next, as shown in FIG. 7, a minute amount of residue (a by-product of reaction) 13a remaining on the interlayer insulating film 1, the porous-low-k film 3 and the low-k film 4 is etched by a chemical solution and removed. As the chemical solution, a hydrofluoric acid such as a hydrofluoric acid (a dilute HF) and a buffered hydrofluoric acid (BHF) or an organic hydrofluoric acid is used. Thereafter, the resultant tube in FIG. 7 is kept at atmospheric pressure at a temperature of about 25° C. and a humidity of 45% or more for about 60 to 600 minutes. Suitably, the resultant tube shown in FIG. 7 is kept at atmospheric pressure at a temperature of about 25° C. and a humidity of 45% to 60%. As a result, the low-pressure gas absorption layer 3c of the porous-low-k film absorbs moisture by taking in water vapor in the atmosphere. In the low-pressure gas absorption layer 3c, the fluorine gas permeated into the microscopic pores reacts with the moisture in the atmosphere and thus etching is advanced. As a result, as shown in FIG. 8, a cavity 5 having an approximately square cross-section is formed between the first and second sidewall insulating films 3a and 3b.

Figure 8:
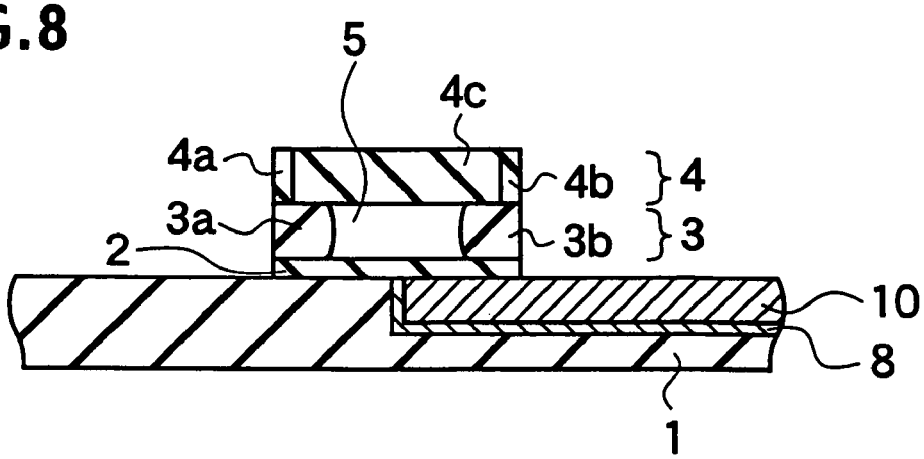
Figure 9:
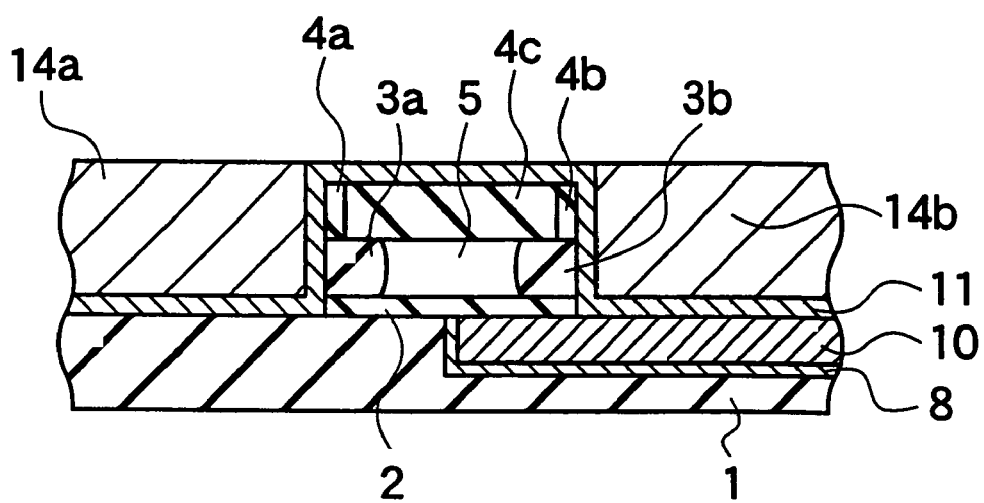

(d) Next, the insulating tube shown in FIG. 8 is subjected to annealing treatment in a $H_2$ ambient at 250° C. to 350° C. for 20 to 30 seconds. As a result of the annealing treatment, moisture left in the porous-low-k film 3 and the low-k film 4 is heated to evaporate. Thereafter, as shown in FIG. 9, by use of plasma CVD or the like, a barrier metal 11 is deposited to have a film thickness of 30 nm to 50 nm on the surfaces of the interlayer insulating film 1, the first and second sidewall insulating films 3a and 3b, the first and second side-beams 4a and 4b and the central beam 4c. Subsequently, a Cu seed layer (not shown) is deposited by sputtering to have a thickness of 50 to 100 nm on the barrier metal 11 and first and second wiring cores 14a and 14b are deposited on the Cu seed layer by plating. Thereafter, by use of CMP or the like, the first and second wiring cores 14a and 14b and the barrier metal 11 are partially removed and planarized.

Through the above-described steps, the insulating tube and the semiconductor device according to the first embodiment of the present invention can be manufactured. In the method the first embodiment, the fluorine gas used in the RIE process and the like or the hydrofluoric acid, the organic hydrofluoric acid or the like, which are used in the etching, reacts with the moisture in the atmosphere and thus the cavity 5 is formed in the porous-low-k film 3. The relative dielectric constant of the cavity 5 is about 1 and thus the relative dielectric constant of the entire insulating tube shown in FIG. 1 can be suppressed to a low level. Moreover, the insulating tube shown in FIG. 1 can control the formation of the cavity 5 to have a certain size in such a manner that the porous-low-k film 3 and the low-k film 4 are maintained at atmosphere pressure under given conditions to absorb the moisture and, thereafter, are annealed under given conditions. Therefore, according to the method of manufacturing the insulating tube and the semiconductor device as shown in FIG. 1, the relative dielectric constant and the capacitance of the porous-low-k film 3, in which the cavity 5 is formed, can be controlled to be constant. Furthermore, in the first and second sidewall insulating films 3a and 3b and the first and second side-beams 4a and 4b, the chemical compositions of the films are changed by contact with the fluorine gas in the RIE process and are hardened. Therefore, even if CMP polishing and the like are performed by burying the first and second wiring cores 14a and 14b around the first and second sidewall insulating films 3a and 3b and the first and second side-beams 4a and 4b, the first and second sidewall insulating films 3a and 3b disposed outside of the cavity 5 are unlikely to be destroyed.

Second Embodiment

Figure 10:
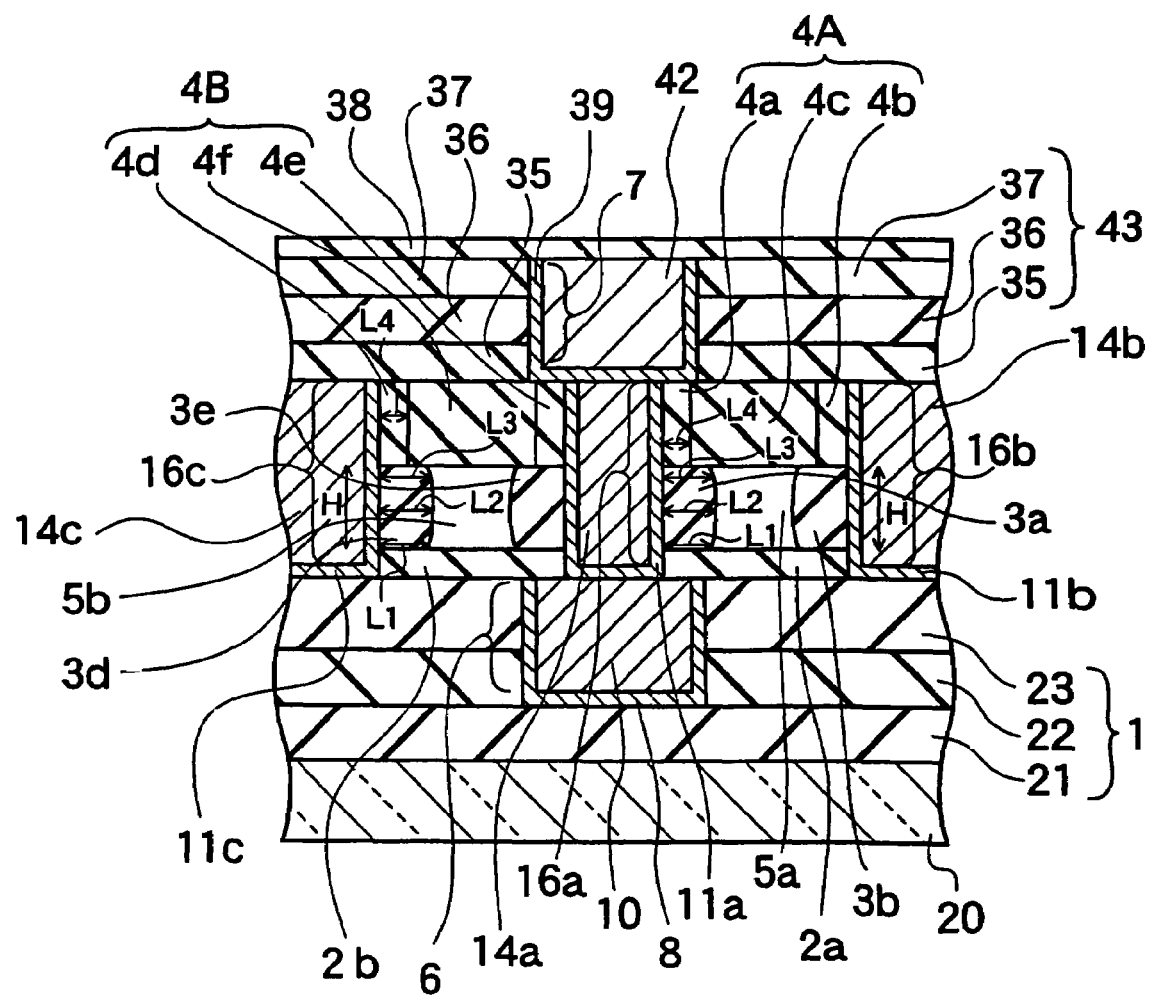
FIG. 10 is a sectional view showing a semiconductor device employing the insulating tube according to a second embodiment of the present invention.

As shown in FIG. 10, a semiconductor device according to a second embodiment of the present invention encompasses a substrate 20, a first interlayer insulating film 1 disposed on the substrate 20, underlying insulating films 2a and 2b disposed on the first interlayer insulating film 1, first and second sidewall insulating films 3a, 3b, 3d, and 3e disposed on the underlying insulating films 2a and 2b, respectively, and facing each other while sandwiching cavities 5a and 5b extending in a longitudinal direction perpendicular to the plane of the paper. Upper insulating films 4A and 4B are disposed on the first and sidewall insulating films 3a, 3b, 3c, and 3d. In FIG. 10, the underlying insulating films 2a and 2b, the first and second sidewall insulating films 3a, 3b, 3c, and 3d, the cavities 5a and 5b and the upper insulating films 4A and 4B constitute the insulating tube shown in FIG. 1. On the upper insulating films 4A and 4B, a second interlayer insulating film 43 is disposed. Barrier metals 11a to 11c are formed on an upper portion of the first interlayer insulating film 1 and on sidewall portions of the underlying insulating films 2a and 2b, the first and second sidewall insulating films 3a, 3b, 3d, and 3e, first and second side-beams 4a, 4b, 4d, and 4e, forming the upper insulating films 4A and 4B, all of which form bridge structures. Via these barrier metals 11a to 11c, first to third wiring cores 14a to 14c are disposed so as to sandwich the bridge structures therebetween, respectively. In FIG. 10, the first wiring core 14a is connected to a wiring core 10 buried in a groove 6 of the first interlayer insulating film 1 and to a wiring core 42 buried in a groove 7 (upper groove) of the second interlayer insulating film 43. Thus, a multi-layered wiring structure is provided.

The first interlayer insulating film 1 encompasses a first insulating film 21 deposited on the substrate 20, a low-k film 22 deposited on the first insulating film 21, and a second insulating film 23 deposited on the low-k film 22. As the first insulating film 21, the low-k film 22 and the second insulating film 23, a $SiO_2$ film and the like are used. Thereafter, the groove 6 is provided so as to permeate the first insulating film 21 and the low-k film 22 and the wiring core 10 is buried in the groove 6 with a barrier metal 8 interposed therebetween. The barrier metal 8 is provided by depositing TiN, Ta, TaN, WN or the like in a film thickness of 20 nm to 70 nm. Cu or the like is used as the wiring core 10 and is buried in the groove 6 with a Cu seed film (not shown) interposed therebetween, which is deposited on the barrier metal 8 in a thickness of about 50 to 100 nm.

The underlying insulating films 2a and 2b disposed on the second insulating film 23 are disposed as separated from each other on the second insulating film 23. As the underlying insulating films 2a and 2b, for example, a $Si_3N_4$ film having a film thickness of about 50 nm to 100 nm and the like can be used.

The first and second sidewall insulating films 3a and 3b are stripes which face each other to form a bank and extend in the longitudinal direction perpendicular to the plane of the paper on the underlying insulating film 2a, respectively. On the underlying insulating film 2b, the first and second sidewall insulating films 3d and 3e are disposed having vertical stripes to form a bank, respectively. The first sidewall insulating films 3a and 3d and the second sidewall insulating films 3b and 3e have a height H is greater than a middle portion width L3 and an aspect ratio thereof is about 1.2 to 2. The cavity 5a is formed between the first and second sidewall insulating films 3a and 3b and the cavity 5b is formed between the first and second sidewall insulating films 3d and 3e. As shown in FIG. 10, in the cavities 5a and 5b, respective cross-sections vertical to a longitudinal direction perpendicular to the plane of the paper, in which the cavities 5a and 5b extend, have approximately square shapes. In the first sidewall insulating films 3a and 3d and the second sidewall insulating films 3b and 3e, bottom portion widths L1 contacting the underlying insulating films 2a and 2b shown in FIG. 10 and top portion widths L2 contacting the upper insulating films 4A and 4B are narrower by 10 to 30 nm than middle portion widths L3 spaced from the top portion width L1 and the bottom portion width L2 of the contact portions. In the insulating tube shown in FIG. 10, it is suitable that each of the bottom portion widths L1 is about 45 to 65 nm, each of the middle portion widths L3 is about 50 to 90 nm and each of the top portion widths L2 is about 45 to 60 nm. Moreover, the first sidewall insulating films 3a and 3d and the second sidewall insulating films 3b and 3e are transmuted layers of the porous-low-k film, in which chemical compositions of the films are changed and hardened. The first sidewall insulating films 3a and 3d and the second sidewall insulating films 3b and 3e have a higher relative dielectric constant than the porous-low-k film immediately after deposited on the underlying insulating films 2a and 2b.

As the upper insulating films 4A and 4B, a SiO or organic insulating film having a film thickness of about 10 nm to 250 nm is used. The more thinly the upper insulating films 4A and 4B are deposited, the more the wiring resistance is reduced. Thus, the film thickness of the upper insulating films 4A and 4B is suitably about 10 nm to 100 nm. The upper insulating film 4A includes the first and second side-beams 4a and 4b and a central beam 4c. The upper insulating film 4B encompasses first and second side-beams 4d and 4e and a central beam 4f. The first and second side-beams 4a and 4b forming the upper insulating film 4A are disposed facing each other on the first and second sidewall insulating films 3a and 3b, respectively. The central beam 4c extending in the longitudinal direction perpendicular to the plane of the paper is formed between first and second side-beams 4a and 4b. The central beam 4c is disposed over the first and second sidewall insulating films 3a and 3b so as to seal the upper portion of the cavity 5a. The first and second side-beams 4d and 4e forming the insulating film 4B are disposed facing each other on the first and second sidewall insulating films 3d and 3e. The central beam 4f extending in the longitudinal direction perpendicular to the paper is formed between first and second side-beams 4d and 4e. The central beam 4f is disposed over the first and second sidewall insulating films 3d and 3e so as to seal the cavity 5b. Heights of the first side-beams 4a and 4d and the second side-beams 4b and 4e and the central beams 4c and 4f are greater than widths thereof. For example, an aspect ratio of the heights and widths of the first side-beams 4a and 4d and the second side-beams 4b and 4e is about 4 to 6. An aspect ratio of the heights and widths of the central beams 4c and 4f is about 1.2 to 2.5. The first side-beams 4a and 4d and the second side-beams 4b and 4e are transmuted layers, in which chemical compositions of the films are changed and hardened. The first side-beams 4a and 4d and the second side-beams 4b and 4e have a higher relative dielectric constant than the low-k film before forming the first side-beams 4a and 4d and the second side-beams 4b and 4e. Further, the width L4 of the first side-beams 4a, 4d and the second side-beams 4b, 4e is narrower than the widths L1 to L3 of the first sidewall insulating films 3a, 3d and the second sidewall insulating films 3b, 3e. In FIG. 10, the width L4 of the first side-beams 4a and 4d and the second side-beams 4b and 4e is formed in a thickness of about 20 to 45 nm. The central beams 4c and 4f are low-k films in which atomic bond of the films is not transmuted. The width of the central beams 4c and 4f is suitably about 100 nm to 160 nm.

The second interlayer insulating film 43 encompasses an etching stop film 35, an insulating film 36 disposed on the etching stop film 35, and a low-k film 37 disposed on the insulating film 36. As the etching stop film 35, a $Si_3N_4$ film having a thickness of about 50 nm to 100 nm can be used. As the insulating film 36 and the low-k film 37, a $SiO_2$ film can be used. The groove 7 is provided while penetrating through the etching stop film 35, the insulating film 36 and the low-k film 37. The wiring core 42 is disposed in this groove 7 with a barrier metal 39 interposed therebetween. The wiring core 42 is connected to the first wiring core 14a disposed via the barrier metal 11a in the sidewall portions of the underlying insulating films 2a and 2b, the first and second sidewall insulating films 3a and 3e and the first and second side-beams 4a and 4e, all of which form the bridge structure.

According to the semiconductor device shown in FIG. 10, the approximately square cavities 5a and 5b are formed respectively between the first and second sidewall insulating films 3a and 3b or between the first and second sidewall insulating films 3d and 3e. The relative dielectric constant of the cavities 5a and 5b is the relative dielectric constant of air, that is, about 1. Thus, an effective dielectric constant can be deceased compared to the case of using a porous-low-k film with no cavities 5a and 5b and the capacity between wirings in the entire device can be reduced. Furthermore, in the first sidewall insulating films 3a and 3d and the second sidewall insulating films 3b and 3e disposed to form a bank around the cavities 5a and 5b, the chemical compositions of the films are changed and hardened and thus mechanical strength thereof is high. The first sidewall insulating films 3a and 3d and the second sidewall insulating films 3b and 3e serves as "sidewalls" for supporting the space between the underlying insulating films 2a and 2b and the upper insulating films 4A and 4B. Thus, destruction of the films due to stresses applied in the semiconductor device by manufacturing processes such as CMP can be minimized.

Next, a method of manufacturing a semiconductor device according to the second embodiment of the present invention is described. The method of manufacturing a semiconductor device to be described below is an example. Thus, it is needless to say that the present invention can be achieved by use of various other manufacturing methods including a modified example of the one described below.

Figure 11:
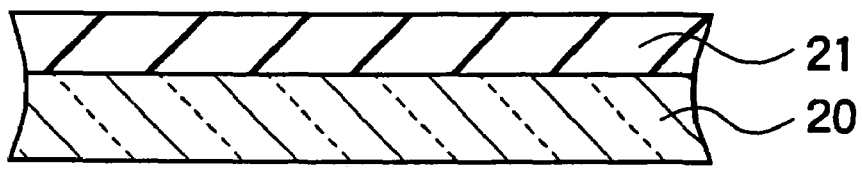
FIGS. 11 to 25 are sectional views showing a method of manufacturing the semiconductor device employing the insulating tube according to the second embodiment of the present invention.

(a) First, as shown in FIG. 11, a substrate 20 which is made of Si and has a thickness of 600 μm to 900 μm is prepared. As the substrate 20, besides Si, epoxy resin, polyimide resin, phenol resin, ceramics, silicon carbide and the like can be also used. Thereafter, a first insulating film 21 made of a $SiO_2$ film or the like is deposited on the entire surface of the substrate 20 by CVD or the like. As the first insulating film 21, besides the $SiO_2$ film, a PSG film, BPSG film, a $Si_3N_4$ film, a polyimide film and the like may be also used.

Figure 12:
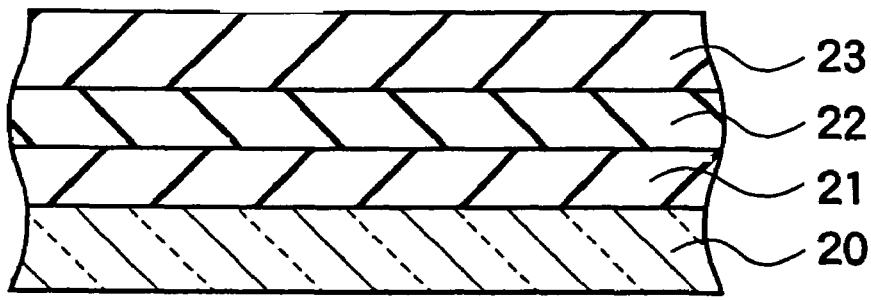
Figure 13:
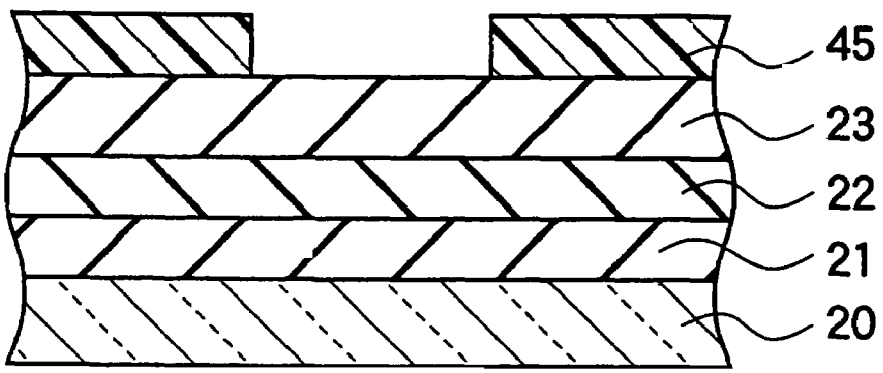
Figure 14:
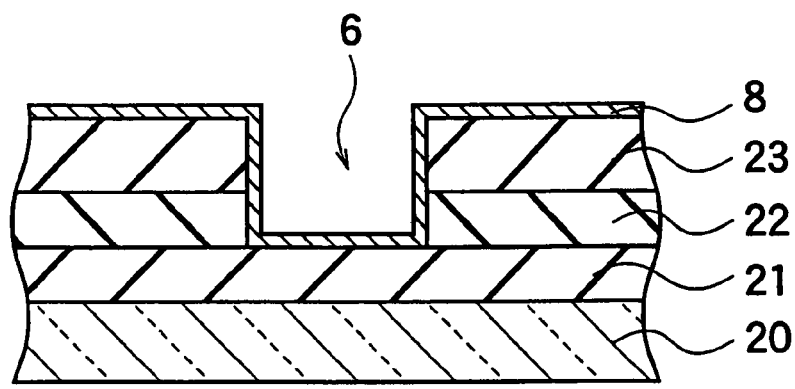

(b) Next, as shown in FIG. 12, on the first insulating film 21, a low-k film 22 and a second insulating film 23 are deposited, respectively, by CVD or the like. Thereafter, as shown in FIG. 13, a photoresist film 45 is applied onto the second insulating film 23 and the photoresist film 45 is delineated by use of photolithography technology. By use of the delineated photoresist film 45 as an etching mask, a part of the low-k film 22 and a part of the second insulating film 23 are selectively stripped by RIE or the like and the groove 6 is formed. Subsequently, as shown in FIG. 14, a barrier metal 8 having a film thickness of 20 nm to 50 nm is deposited on the resultant tube by plasma CVD or the like.

Figure 15:
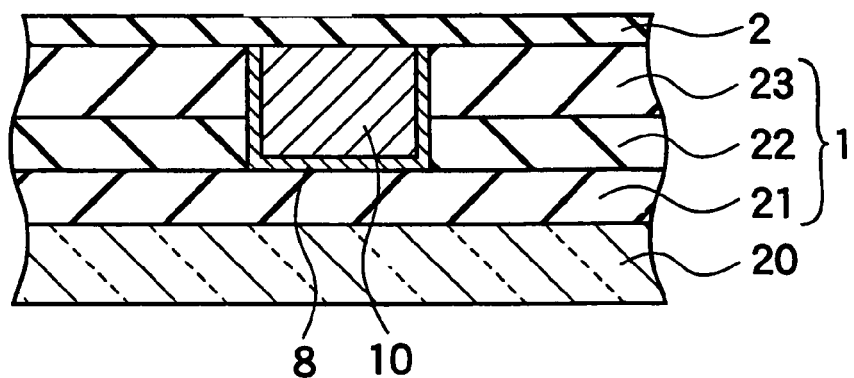
Figure 16:
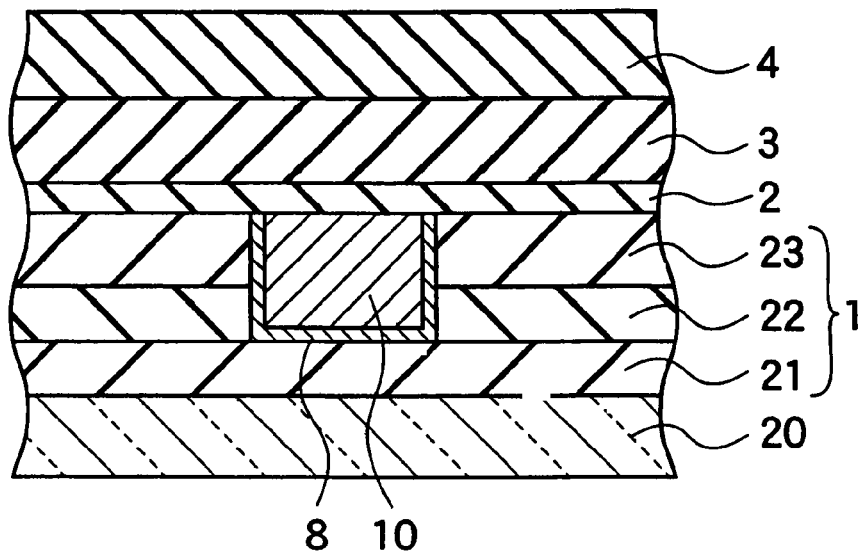

(c) Next, a Cu seed layer (not shown) is deposited in a thickness of 50 to 100 nm on the barrier metal 8 by sputtering and a wiring core 10 is deposited on the Cu seed layer by plating or the like. Subsequently, after planarizing the surface of the second insulating film 23 by CMP or the like, as shown in FIG. 15, a underlying insulating film 2 is deposited to have a film thickness of about 10 nm to 100 nm on the entire surface of the resultant structure by CVD or the like. Thereafter, as shown in FIG. 16, a porous-low-k film 3 is deposited to have a film thickness of 50 nm to 150 nm on the underlying insulating film 2 by CVD or the like. Furthermore, on the porous-low-k film 3, a low-k film 4 having a higher relative dielectric constant than the porous-low-k film 3 is deposited to have a film thickness of 10 nm to 100 nm by CVD or the like.

Figure 17:
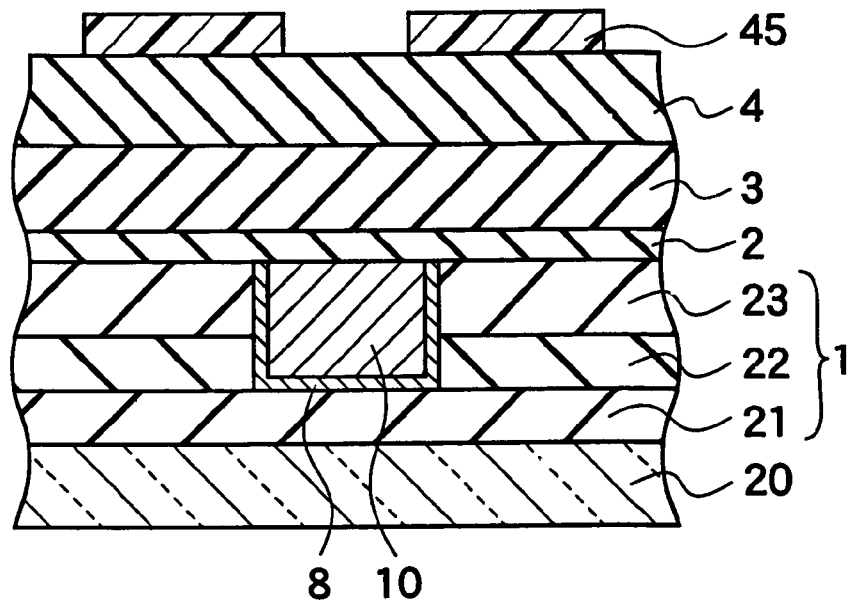
Figure 18:
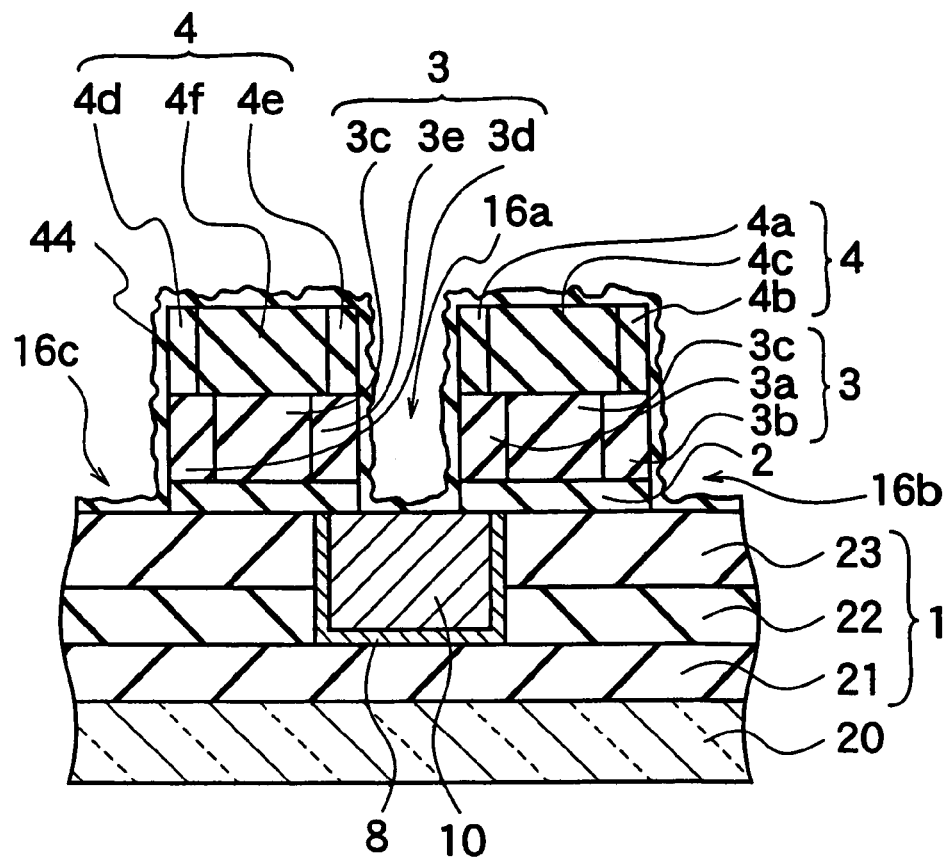

(d) Next, a photoresist film 45 is applied onto the low-k film 4 and the photoresist film 45 is delineated by use of photolithography technology as shown in FIG. 17. By use of the delineated photoresist film 45 as an etching mask, as shown in FIG. 18, a part of the porous-low-k film 3 and a part of the low-k film 4 are selectively stripped by RIE using fluorine gas or the like. Thus, grooves 16a to 16c are formed. Sidewall portions of the porous-low-k film 3 and the low-k film 4, which remain above the second insulating film 23, are eroded by the fluorine gas used in RIE and the like and degenerated. Accordingly, first sidewall insulating films 3a and 3d, second sidewall insulating films 3b and 3e, first side-beams 4a and 4d and second side-beams 4b and 4e are formed and central portions of the porous-low-k film 3 remain as low-pressure gas absorption layers 3c and 3f.

(e) Next, by performing ashing in addition to RIE, a residue 44 around the underlying insulating film 32, the porous-low-k film 3 and the low-k film 4 is stripped. As a result, the residue 44 shown in FIG. 18 is stripped and the fluorine gas used in RIE permeates into microscopic holes of the low-pressure gas absorption layer 3c between the first and second sidewall insulating films 3a and 3b and of the low-pressure gas absorption layer 3f between the first and second sidewall insulating films 3d and 3e. Furthermore, a minute amount of the residue 44 is selectively stripped by chemical solution. As the chemical solution, a hydrofluoric acid such as a dilute HF and a BHF or an organic hydrofluoric acid is used. Thereafter, the resultant structure shown in FIG. 18 is kept at the atmospheric pressure at a temperature of about 25° C. and a humidity of 50% or more for about 60 to 600 minutes. Moisture in the atmosphere permeates the low-pressure gas absorption layers 3c and 3f which are made of the porous-low-k film. Since the fluorine gas used in the RIE process remains in the microscopic pores of the low-pressure gas absorption layers 3c and 3f, the moisture in the atmosphere reacts with the fluorine. As a result, the low-pressure gas absorption layers 3c and 3f are removed and cavities 5a and 5b as shown in FIG. 19 are formed, which have approximately square cross-sections.

Figure 19:
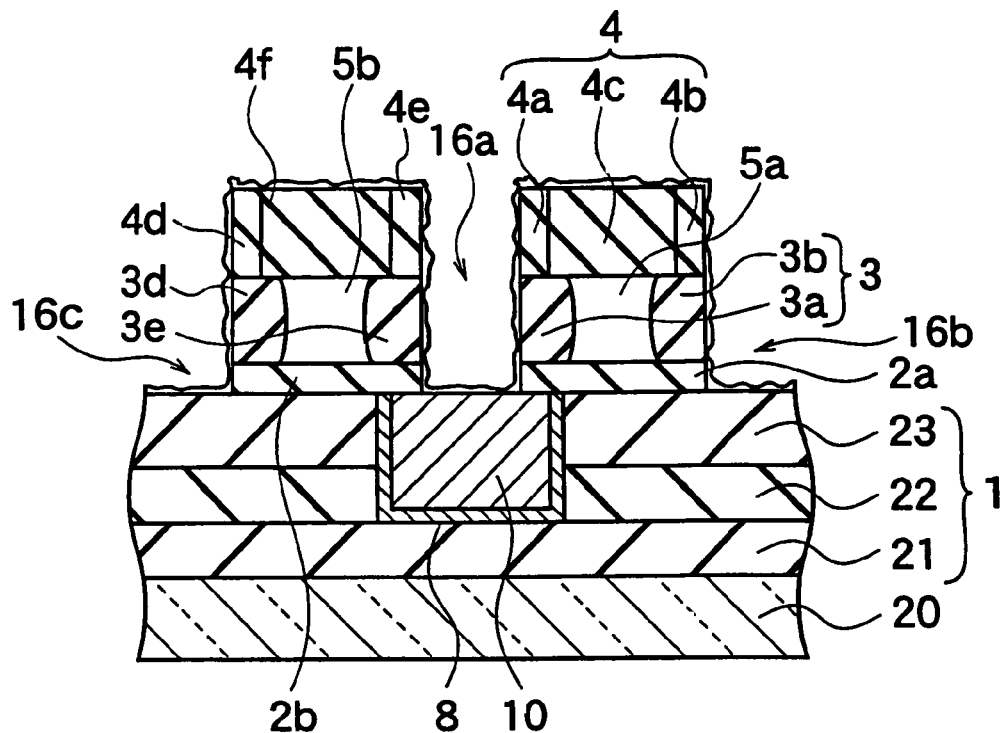
Figure 20:
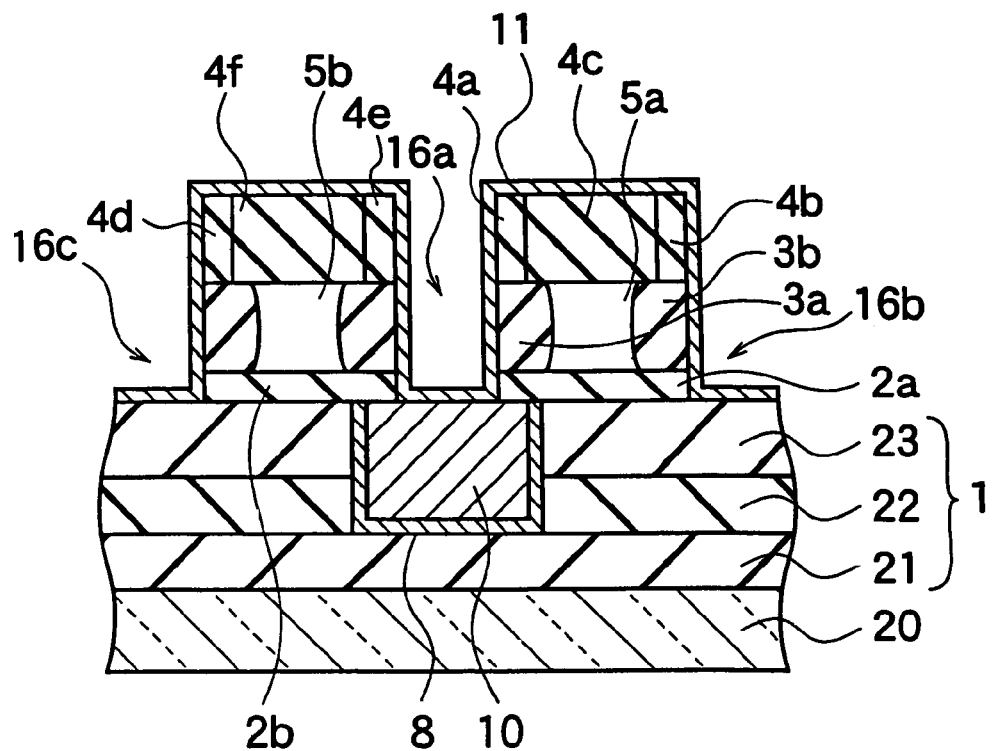
Figure 21:
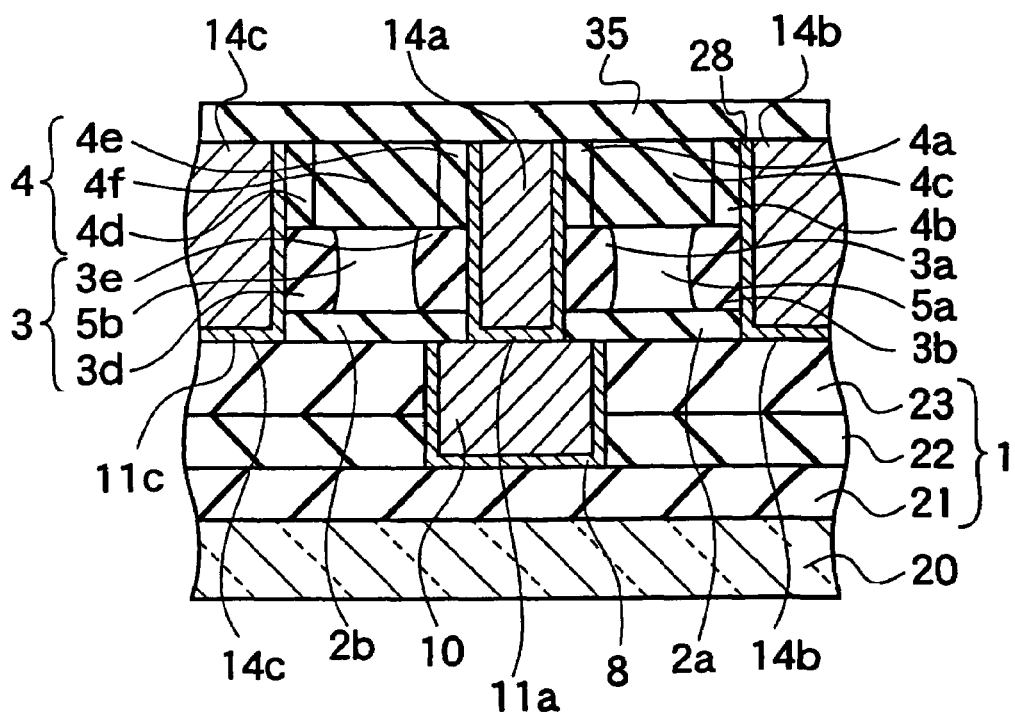

(f) Next, the semiconductor device shown in FIG. 19 is subjected to annealing treatment in a $H_2$ ambient at 250° C. to 350° C. for 20 to 30 seconds. As a result of the annealing treatment, moisture left in the porous-low-k film 3 and the low-k film 4 is heated so as to evaporate. Thereafter, as shown in FIG. 20, by use of plasma CVD or the like, a barrier metal 11 is deposited to have a film thickness of 30 nm to 50 nm on the grooves 16a to 16c. Subsequently, a Cu seed layer (not shown) is deposited by sputtering to have a thickness of 50 to 100 nm on the barrier metal 11 and first to third wiring cores 14a to 14c are deposited in a thickness of 50 nm to 200 nm on the Cu seed layer by plating or the like. Subsequently, after polishing the surface of the low-k film 4 by use of CMP or the like, an etching stop film 35 is deposited thereon.

Figure 22:
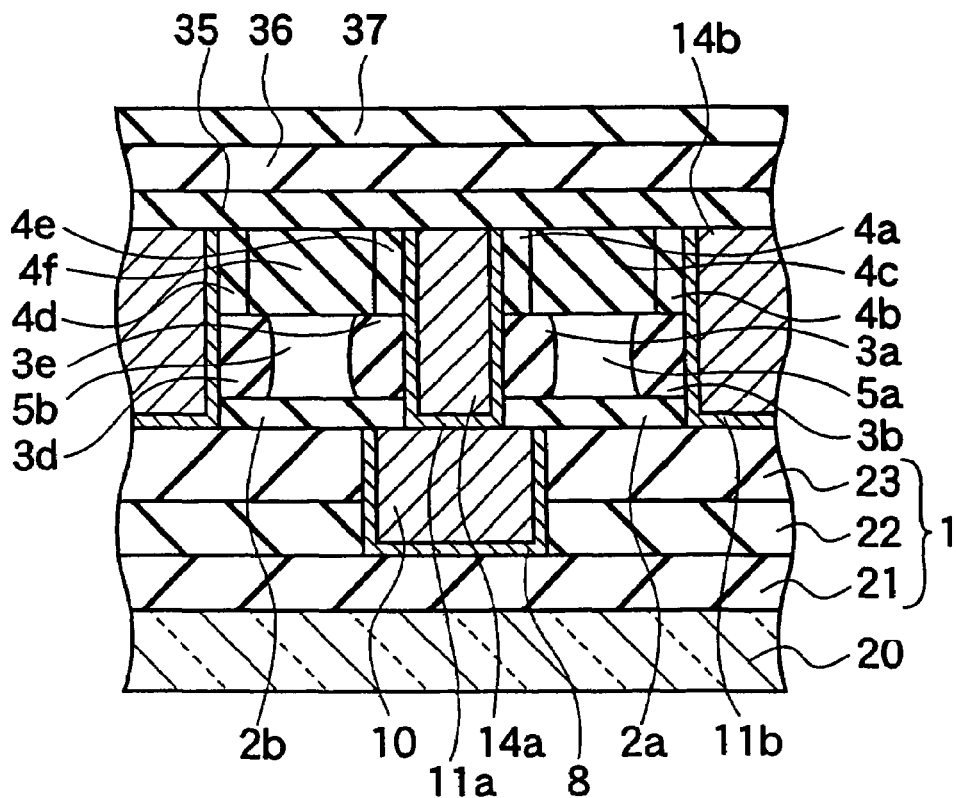
Figure 23:
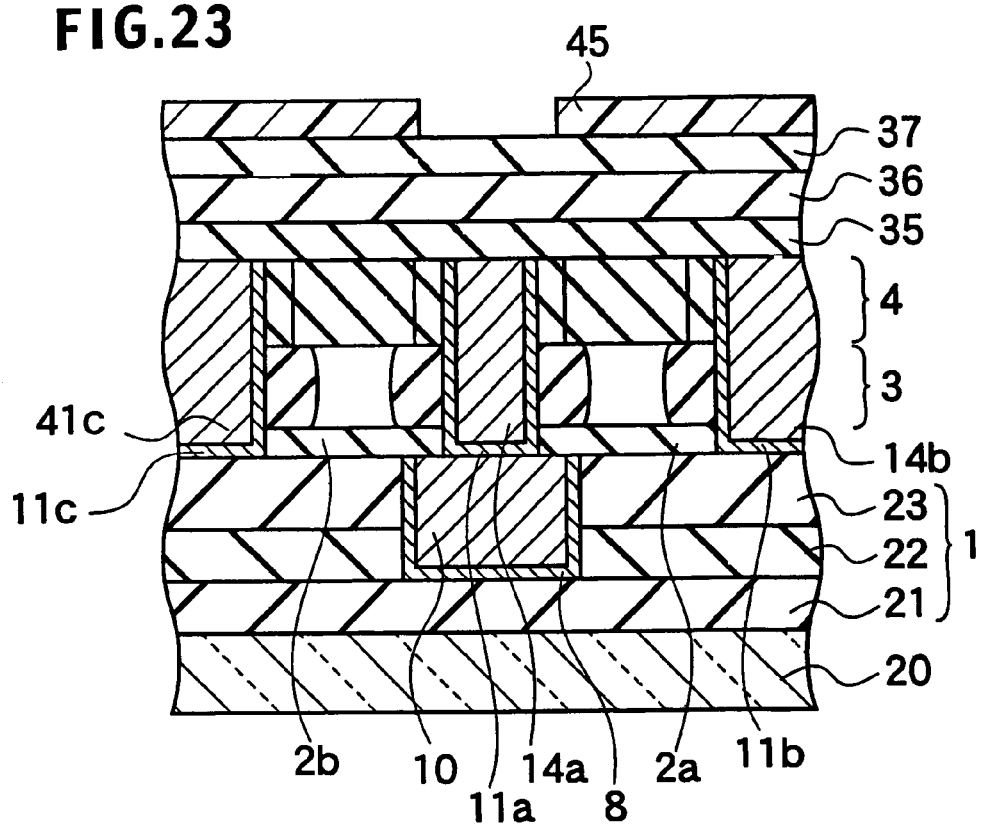
Figure 24:
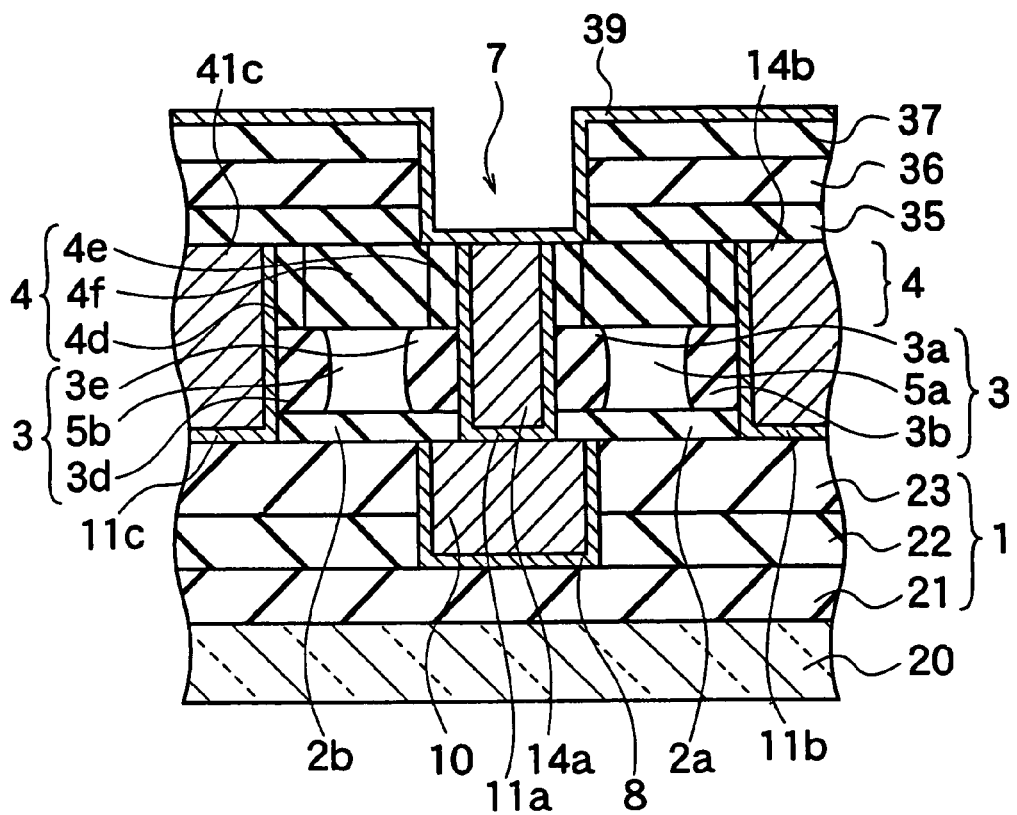
Figure 25:
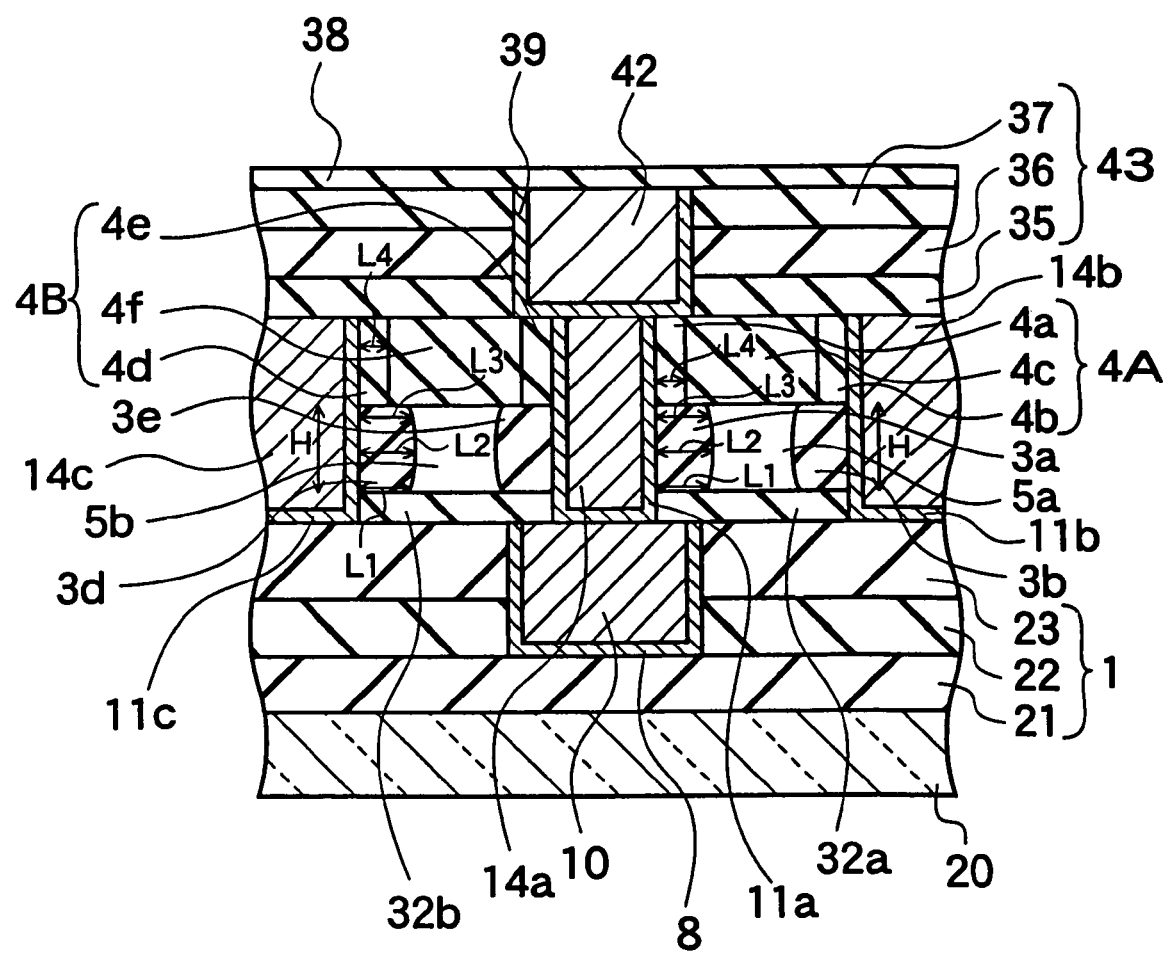

(g) Furthermore, as shown in FIG. 22, an insulating film 36 is deposited to have a film thickness of 50 nm to 150 nm on the entire surface of the etching stop film 35 by CVD or the like. Thereafter, a low-k film 37 is deposited to have a film thickness of 10 nm to 100 nm on the insulating film 36. Subsequently, a photoresist film 45 is applied onto the low-k film 37 and the photoresist film 45 is delineated by use of photolithography technology as shown in FIG. 23. By use of the delineated photoresist film 45 as an etching mask, the etching stop film 35, the third insulating film and the low-k film 37 are partially stripped by RIE using fluorine gas and thus a groove 7 is formed. Subsequently, ashing and annealing treatments are performed in addition to RIE, and a barrier metal 39 is deposited on the groove 7 and the low-k film by CVD or the like as shown in FIG. 24. A wiring core 42 is formed on the barrier metal 39 by plating with a Cu seed layer (not shown) interposed therebetween. The wiring core 42 and the barrier metal 39 are polished by CMP and thus an etching stop film 38 is formed.

Through the above-described steps, the semiconductor device according to the second embodiment of the present invention can be manufactured. In the method of manufacturing a semiconductor device according to the second embodiment, the fluorine gas used in the RIE process or the hydrofluoric acid, the organic hydrofluoric acid or the like, which are used in the etching, reacts with the moisture in the atmosphere and thus the cavities 5a and 5b are formed in the porous-low-k film 3. The relative dielectric constant of the cavities 5a and 5b is the relative dielectric constant of air, that is, about 1. Thus, the effective dielectric constant and the wiring capacitance of the entire device can be suppressed lower in comparison to the case of using a porous-low-k film having no cavities 5a and 5b. Moreover, the cavities 5a and 5b can be controlled to have a certain shape in such a manner that the porous-low-k film 3 and the low-k film 4 are maintained at atmospheric pressure under given conditions to absorb the moisture and, thereafter, are annealed under given conditions. Therefore, the effective dielectric constant of the semiconductor device shown in FIG. 10 can be controlled to have a constant value. Furthermore, in the first and second sidewall insulating films 3a, 3b, 3d and 3e and the first and second side-beams 4a, 4b, 4d and 4e, the chemical compositions of the films are changed by the method of manufacturing a semiconductor device shown in FIGS. 11 to 25 and are hardened. Thus, the first and second sidewall insulating films 3a, 3b, 3d and 3e can serve as "sidewalls" for supporting the space between the underlying insulating film 2 and the upper insulating film 4. Therefore, according to the semiconductor device shown in FIG. 10, even if mechanical stresses, such as applied in CMP and the like, are applied thereto, damage on destruction of the films is unlikely to occur.

As described above, the present invention has been described according to the first and second embodiments. However, it should be understood that the present invention is not limited to the description and drawings which constitute a part of this disclosure. Various alternative embodiments, examples and operation technologies will become apparent to those skilled in the art from this disclosure. For example, in the methods of manufacturing a semiconductor device according to the first and second embodiments, it is also possible that the porous-low-k film 3 and the low-k film 4 are dipped in a hydrofluoric solution of about 1 to 5 ppm to absorb moisture and the cavities 5a and 5b are formed. Moreover, the kind of first and second interlayer insulating films 1 and 43 of the semiconductor device shown in FIG. 10, and the like can be changed accordingly.

What is claimed is:

1. A semiconductor device comprising:
   a substrate;
   a first interlayer insulating film disposed on the substrate;
   an underlying insulating film disposed on the first interlayer insulating film;
   a first sidewall insulating film disposed on the underlying insulating film;
   a second sidewall insulating film disposed on the underlying insulating film, opposite to the first sidewall insulating film so as to provide a cavity between the first and second sidewall insulating films having the same height as the first sidewall insulating film;
   an upper insulating film provided over the first and second sidewall insulating films, including:
      a central beam laid over the first and second sidewall insulating films so as to seal an upper portion of the cavity;
      a first side-beam disposed on the first sidewall insulating film having the same height as the central beam; and
      a second side-beam disposed on the second sidewall insulating film and having the same height as the first side-beam so as to sandwich the central beam with the first side-beam; and
   a wiring disposed around the first and second sidewall insulating films.

2. The semiconductor device of claim 1, wherein the width of the first side-beam is narrower than the width of the first sidewall insulating film and the width of the second side-beam is narrower than the width of the second sidewall insulating film.

3. A semiconductor device comprising:
   a substrate;
   a first interlayer insulating film disposed on the substrate;
   an underlying insulating film disposed on the first interlayer insulating film;
   a first sidewall insulating film disposed on the underlying insulating film;
   a second sidewall insulating film disposed on the underlying insulating film, opposite to the first sidewall insulating film so as to provide a cavity between the first and second sidewall insulating films having the same height as the first sidewall insulating film;
   an upper insulating film provided over the first and second sidewall insulating films; and
   a wiring disposed around the first and second sidewall insulating films,
   wherein a bottom portion width of the first sidewall insulating film contacting the underlying insulating film is 10 nm to 30 nm narrower than a middle portion width of the first sidewall insulating film spaced from the underlying insulating film and a bottom portion width of the second sidewall insulating film contacting the underlying insulating film is 10 nm to 30 nm narrower than a middle portion width of the second sidewall insulating film spaced from the underlying insulating film.

4. A semiconductor device comprising:
   a substrate;
   a first interlayer insulating film disposed on the substrate;
   an underlying insulating film disposed on the first interlayer insulating film;
   a first sidewall insulating film disposed on the underlying insulating film;
   a second sidewall insulating film disposed on the underlying insulating film, opposite to the first sidewall insulating film so as to provide a cavity between the first and second sidewall insulating films having the same height as the first sidewall insulating film;
   an upper insulating film provided over the first and second sidewall insulating films; and
   a wiring disposed around the first and second sidewall insulating films,
   wherein a top portion width of the first sidewall insulating film contacting the upper insulating film is 10 nm to 30 nm narrower than a middle portion width of the first sidewall insulating film spaced from the upper insulating film and a top portion width of the second sidewall insulating film contacting the upper insulating film is 10 nm to 30 nm narrower than a middle portion width of the second sidewall insulating film spaced from the upper insulating film.

* * * * *